US006621309B2

(12) United States Patent
Roder et al.

(10) Patent No.: US 6,621,309 B2
(45) Date of Patent: Sep. 16, 2003

(54) DRIVE CIRCUIT

(75) Inventors: Matthias Roder, Reutlingen (DE); Horst Flock, Reutlingen (DE)

(73) Assignee: AFL Germany Electronics GmbH, Frickenhausen (DE)

( * ) Notice: Subject to any disclaimer, the term of this patent is extended or adjusted under 35 U.S.C. 154(b) by 0 days.

(21) Appl. No.: 10/216,063

(22) Filed: Aug. 8, 2002

(65) Prior Publication Data

US 2003/0034808 A1 Feb. 20, 2003

Related U.S. Application Data

(63) Continuation of application No. PCT/EP01/15042, filed on Dec. 19, 2001.

(30) Foreign Application Priority Data

Dec. 20, 2000 (DE) ......................... 100 65 194

(51) Int. Cl.[7] .................................................. H03K 1/00
(52) U.S. Cl. ...................................... 327/110; 327/108
(58) Field of Search ................................ 327/108, 110, 327/304

(56) References Cited

U.S. PATENT DOCUMENTS 3,939,363 A * 2/1976 Engel .......................... 361/111
5,140,201 A * 8/1992 Uenishi ...................... 327/108
5,646,460 A   7/1997 Bocchiola et al. .......... 307/109
5,917,254 A * 6/1999 Lecce et al. ................. 307/125
5,977,743 A   11/1999 Flock .......................... 318/811
6,091,274 A * 7/2000 Preslar ........................ 327/110

FOREIGN PATENT DOCUMENTS

DE       295 15 355       1/1996
DE       197 02 949       7/1998
EP       1 028 527        8/2000

* cited by examiner

Primary Examiner—Toan Tran
(74) Attorney, Agent, or Firm—Barry R. Lipsitz (57) ABSTRACT

To improve a control circuit for at least one inductive load, comprising a first load branch, which lies between a first voltage terminal and a second voltage terminal and comprises an electronic switch and the inductive load connected in series, the electronic switch lying between a first terminal of the inductive load and the first voltage terminal, and a second terminal of the inductive load being in connection with the second voltage terminal, a freewheeling diode, via which a freewheeling current of the inductive load flows when the electronic switch is open, in such a way that smallest possible fluctuations of the supply current and smallest possible voltage peaks occur at the voltage terminals, it is proposed that there is provided a freewheeling branch which has, as a series connection, a capacitance connected to the first voltage terminal and an inductance connected to the second terminal of the inductive load, and also a freewheeling diode lying between a center tap between the capacitance and the inductance of the freewheeling branch and the first terminal of the inductive load.

19 Claims, 8 Drawing Sheets

DRIVE CIRCUIT

The present disclosure relates to the subject matter disclosed in PCT application No. PCT/EP01/15042 of Dec. 19, 2001, which is incorporated herein by reference in its entirety and for all purposes.

BACKGROUND OF THE INVENTION

The invention relates to a drive circuit for at least one inductive load, comprising a first load branch, which lies between a first voltage terminal and a second voltage terminal and comprises an electronic switch and the inductive load connected in series, the electronic switch lying between a first terminal of the inductive load and the first voltage terminal, and a second terminal of the inductive load being in connection with the second voltage terminal, and also comprising a freewheeling diode, via which a freewheeling current of the inductive load flows when the electronic switch is open.

A control circuit of this type is known from the prior art, for example from DE 197 02 949 A1.

In the case of freewheeling circuits of this type, there is the problem that the supply current is subject to considerable fluctuations on account of the switching off of the electronic switch and also that, in spite of suitable driving of the electronic switch, voltage peaks occur.

The invention is therefore based on the object of improving a control circuit of the generic type in such a way that smallest possible fluctuations of the supply current and smallest possible voltage peaks occur at the voltage terminals.

SUMMARY OF THE INVENTION

This object is achieved according to the invention in the case of a control circuit of the type described at the beginning by providing a freewheeling branch which has, as a series connection, a capacitance connected to the first voltage terminal and an inductance connected to the second terminal of the inductive load, and also a freewheeling diode lying between a center tap between the capacitance and the inductance of the freewheeling branch and the first terminal of the inductive load.

It is to be regarded as the advantage of the solution according to the invention that, during the transition from the energized state into the freewheeling state of the capacitance and the inductance of the freewheeling branch, fluctuations of the supply current flowing to the voltage terminals are reduced and, furthermore, voltage peaks occurring at the electronic switch and at the center tap of the freewheeling branch are equalized and do not have any effect, or only an insignificant effect, on the first voltage terminal and the second voltage terminal, and consequently the first voltage terminal and the second voltage terminal are shielded against undesired voltage peaks.

A particularly advantageous embodiment of the solution according to the invention provides that at least one second load branch is connected in parallel with the freewheeling branch.

Such a parallel connection of a second load branch allows the advantages according to the invention to be achieved with one and the same freewheeling branch when there are two or more load branches, so that a saving with regard to the expenditure on circuitry can be achieved.

The second load branch is preferably connected in parallel with the freewheeling branch in the same way as the first load branch, so that similar conditions are obtained.

It is particularly favorable if the second load branch is constructed in principle with the same circuit configuration as the first load branch, i.e. in particular has an electronic switch and a series-connected inductive load and also a center tap between the latter in the corresponding circuit arrangement.

In this case, it is not necessary for the electrical variables of the components of the second load branch to be identical to those of the first load branch. Rather, it is possible without any problem to work with components which have different electrical variables in the load branches, for example with different inductive loads.

To keep the undesired voltage peaks at the center tap of the respective load branch as small as possible, it is preferably provided that a first terminal of the capacitance of the freewheeling branch is connected to a first terminal of the electronic switch by means of a line whose inductance is less than 50 nano Henry. With such a low-inductive connection, the quickest possible current change of the current through the capacitor can be achieved.

Furthermore, it is favorable for keeping the voltage peaks small if a second terminal of the capacitance of the freewheeling branch is connected to the respective diode by a line whose inductance is less than 50 nano Henry, so that the quickest possible change of the current can also take place in this line.

With regard to the driving of the electronic switches for two load branches, so far no further details have been provided. So, an advantageous exemplary embodiment envisages provision of a drive for the electronic switches of the at least two load branches which drives the electronic switches with pulse-width-modulated drive signals or PWM drive signals of the same period, so that circuit-related simplifications are possible with regard to the generation of the PWM drive signals.

To allow the PWM drive signals for both load branches to be synchronized, however, it is preferably provided that the PWM drive signals for both load branches are phase-locked in relation to one another.

It is even more advantageous if the PWM drive signals are phase-shifted in relation to one another, so that there is a possibility of operating the freewheeling branch with as little loading as possible by attempting to associate an energized state in one load branch with a freewheeling state in the other load branch.

This can be achieved particularly favorably if the switching-on instant of one of the electronic switches and the switching-off instant of the other of the electronic switches are fixed in relation to one another and if the period of time between the switching-on instant of the one of the electronic switches and the switching-on instant of the other of the electronic switches varies in a way corresponding to the value of the PWM ratio to be set. This solution allows the electronic switches to be operated in a phase-locked manner with PWM signals of the same period, and at the same time also allows the PWM ratio to be varied.

It is particularly favorable in this case if a drive drives the electronic switches in the first and second load branches in such a way that one of the electronic switches is switched on when the other of the electronic switches is switched off. As a result, a state in which one load branch is in the freewheeling state and the other is in the energized state can be achieved, at least for a brief time, at least for part of the period.

It is particularly advantageous if, in a first operating range, switching-on of each of the electronic switches only takes place when the other electronic switch is switched off.

This operating mode allows the freewheeling branch to be loaded as little as possible in a first operating range, since it is always ensured that one of the load branches is in the freewheeling state as long as the other of the load branches is in the energized state.

This can be advantageously realized if, in the first operating range, the switching-off of each of the electronic switches takes place with a time interval before the switching-on of the other electronic switch.

An advantageous solution provides in this case that, in the first operating range, a minimum time of, for example, 0.5% of the period is provided between the switching-off of each of the electronic switches and the switching-on of the other electronic switch, so that the electronic switch which is switching off is reliably switched off.

Furthermore, in the first operating range, in spite of phase-locked operation of the electronic switches, the PWM drive signals can be varied by varying in the first operating range the switching-on instant of the one electronic switch and the switching-off instant of the other electronic switch in relation to the switching-off instant of the one electronic switch and the switching-on instant of the other electronic switch.

However, it is only possible to operate the electronic switches in the first operating range until a PWM ratio of approximately 50% is reached.

When there is a PWM ratio of over 50%, the conditions explained above cannot be realized.

For this reason, it is preferably provided that, in a second operating range, switching-on of one of the electronic switches only takes place during the switching-off or after the switching-off of the other of the electronic switches. This procedure makes it possible, at least partly, to carry out the switching-off of the one electronic switch and the switching-on of the other electronic switch approximately at the same time or at least around the same time.

This solution is particularly suitable whenever a changeover is made from the first operating state into a second operating state and PWM ratios of over 50% are used in the second operating state for controlling the electronic switches.

Another possibility provides that, in the second operating range, switching-on of each of the electronic switches takes place after the switching-on and before the switching-off of the other of the electronic switches.

The explanation so far of the solution according to the invention has not covered the dimensioning of the freewheeling branch.

For instance, a particularly advantageous exemplary embodiment provides that the product of the value of the inductance and the value of the capacitance in the freewheeling branch is greater than the square of the cycle time of the pulse-width-modulated drive signals.

This dimensioning achieves the effect that current changes and voltage peaks during the switching-off and switching-on of the electronic switches have an effect on the supply voltage terminal and the ground terminal only to the small degree desired.

To achieve best possible suppression of current changes and voltage peaks, it is preferably provided that the value of the capacitance of the freewheeling branch is greater than the product of the maximum value of the current through the inductive load or the inductive loads by the cycle time, divided by the voltage between the first voltage terminal and the second voltage terminal.

In dimensioning, it must be taken into account here that, when there are a plurality of load branches, the greater value of the maximum possible currents in each case through the load branches must always be considered as the current through the inductive load.

The solution according to the invention works in all cases in which one of the voltage terminals is connected to the supply voltage terminal and the other of the voltage terminals is connected to the ground terminal.

It is particularly favorable, however, in particular for the application of the solution according to the invention in a motor vehicle, if the first voltage terminal is connected to the supply voltage terminal and the second voltage terminal is connected to the ground terminal.

Further features and advantages of the invention are the subject of the following description and the graphic representation of some exemplary embodiments.

DETAILED DESCRIPTION OF THE INVENTION

Figure 1:
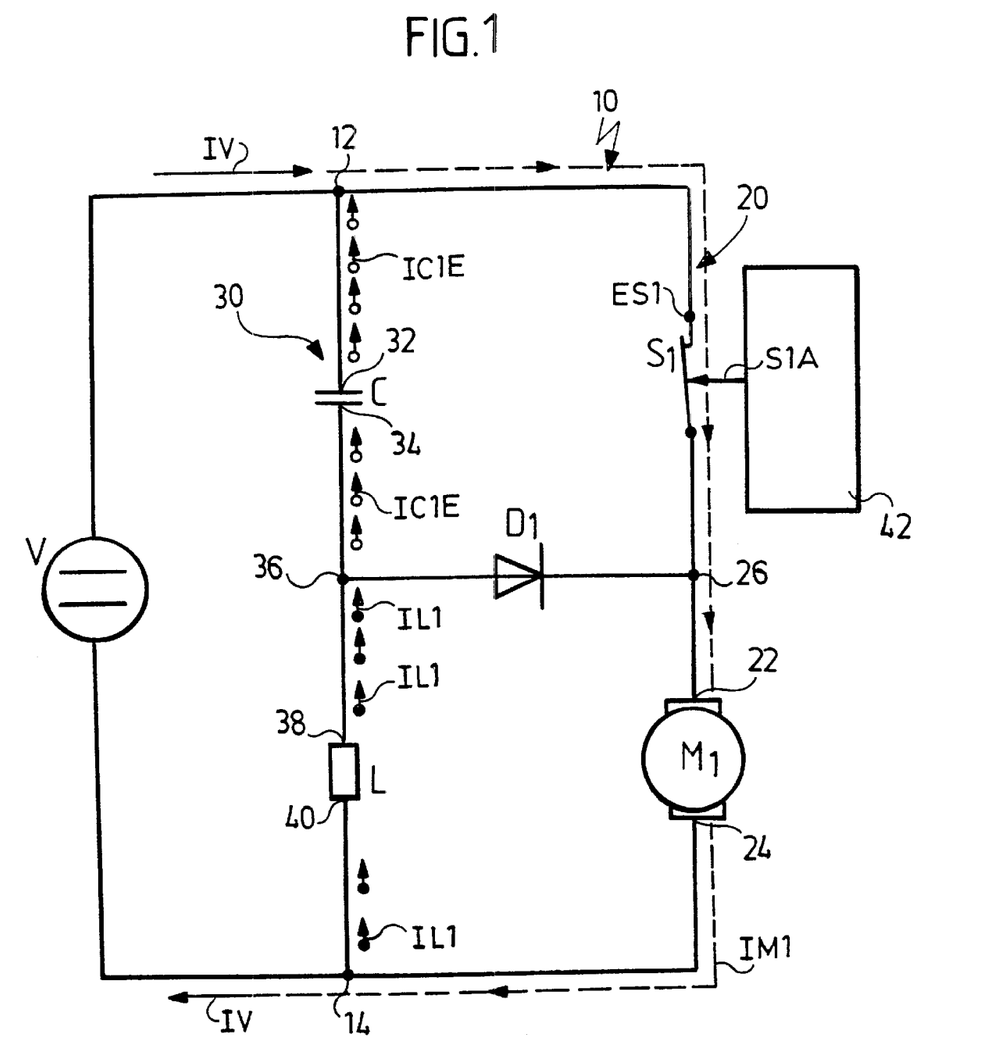
FIG. 1 shows a circuit diagram of a first exemplary embodiment of a control circuit according to the invention, with a first load branch in the energized state.

A first exemplary embodiment of a drive circuit 10 according to the invention, for example for a motor M1 representing an inductive load, with which a fan wheel in a motor vehicle is driven, for example, comprises a voltage source V, which lies between a supply voltage terminal 12 and a ground terminal 14 of the drive circuit 10 and generates a supply voltage U.

Furthermore, the drive circuit 10 comprises a first load branch 20, in which an electronic switch S1 and the inductive load, in this case the motor M1, are connected in series, the electronic switch S1 lying between a first terminal 22 of the inductive load and the supply voltage terminal 12 and being connected in this case by a first terminal ES1 to the supply voltage terminal 12, and a second terminal 24 of the inductive load M1 being connected to the ground terminal 14.

Furthermore, the first terminal 22 of the inductive load is connected to a center tap 26 of the first load branch 20.

In addition, the drive circuit according to the invention comprises a freewheeling branch 30, in which a capacitance C and an inductance L are connected in series, a first terminal 32 of the capacitance C being connected to the supply voltage terminal 12 and a second terminal 34 of the capacitance C being connected to a center tap 36 of the freewheeling branch 30, which for its part is in turn connected to a first terminal 38 of the inductance L, which is connected via a second terminal 40 to the ground terminal 14.

Furthermore, lying between the center tap 36 of the freewheeling branch 30 and the center tap 26 of the first load branch 20 is a freewheeling diode D1 of the freewheeling branch 30, the forward direction of which is chosen such that it allows a current to flow from the center tap 36 to the center tap 26, but blocks in the reverse direction.

The electronic switch S1 can also be driven by means of a first pulse-width-modulated drive signal S1A, which is generated by a motor control circuit 42 in a way corresponding to the required power of the motor M1 and with a fixed cycle time TZ.

The drive circuit according to the invention in this case operates as follows:

If the electronic switch S1 is closed by the pulse-width-modulated drive signal S1A, a current IM1, identified by dashed lines with arrows, flows to operate the motor M1 during an energizing time TS from the supply voltage terminal 12 via the first electronic switch S1, the center tap 26 and the motor M1 to the ground terminal 14.

The current IM1 through the motor M1 is in this case the sum of the partial currents IV and IC1E coming together at the supply voltage terminal 12, the voltage source V supplying the partial current IV, and the partial current IC1E being caused by discharging of the capacitor C to flow away from the first terminal 32 of the latter in the direction of the supply voltage terminal 12.

Furthermore, a current IL1 flows from the ground terminal 14 through the inductance L, to be precise in the direction of the center tap 36, and from the center tap 36 as a current IC1E to the second terminal 34 of the capacitor C, so that the current IM1 is divided at the ground terminal 14, the partial current IV flowing to the voltage source V, while the partial current IL1 flows through the inductance L to the capacitor C, with IC1E and IL1 being of the same magnitude in this case.

Figure 2:
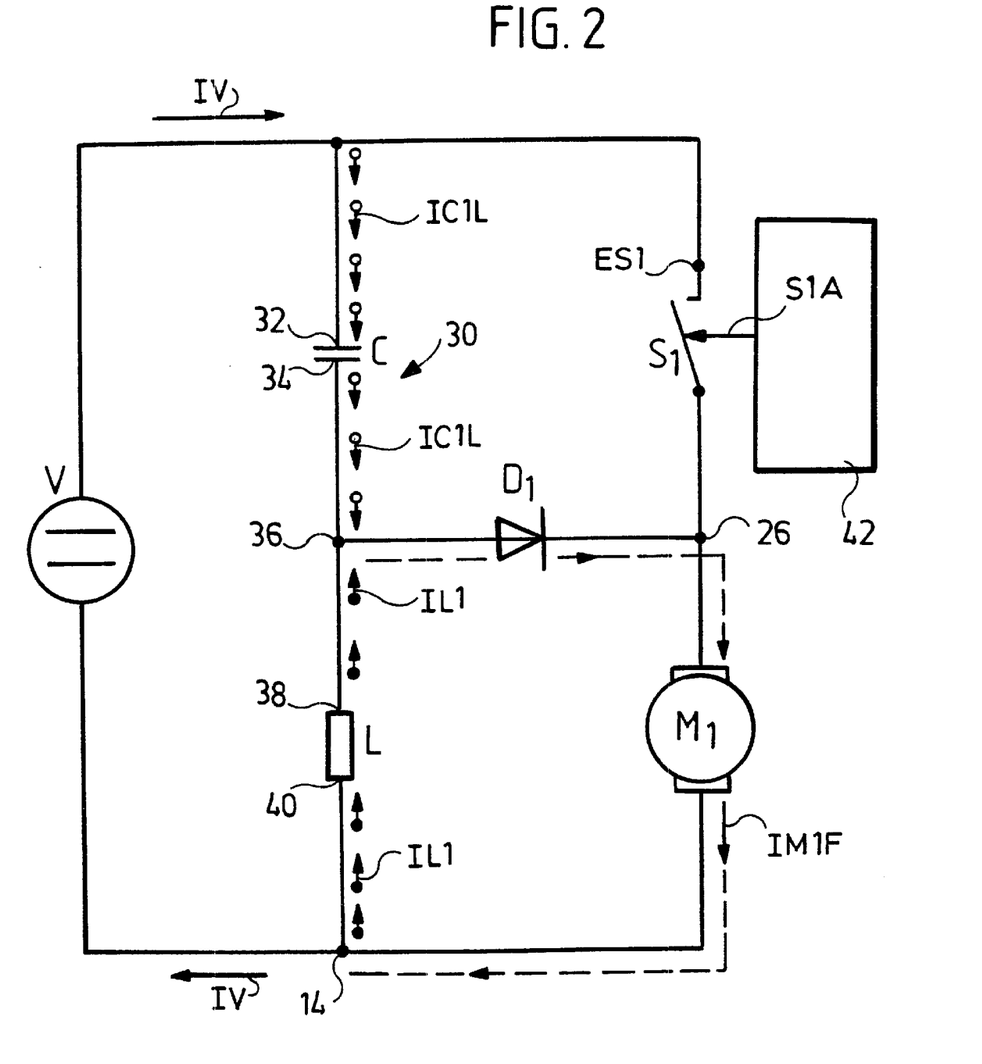
FIG. 2 shows a circuit diagram of the first exemplary embodiment in the freewheeling state of the first load branch.

If, on the other hand, as represented in FIG. 2, the switch S1 is opened by the drive signal S1A, no current flows any longer from the supply voltage terminal 12 via the electronic switch S1, and the motor M1 is operated in the freewheeling state for the duration of a freewheeling time TF. During this time, a current IC1L opposite to the current IC1E flows from the supply voltage terminal 12 to the first terminal 32 of the capacitor C and charges the latter, the current IC1L corresponding to the current IV, which flows from the voltage source V to the supply voltage terminal 12. In this case, the current IV is approximately of the same magnitude during the energizing period TS and the freewheeling period.

Furthermore, the current IC1L flows from the second terminal 34 of the capacitor C to the center tap 36.

In the freewheeling state, a current IM1F flows from the center tap 36 via the diode 1 to the center tap 26 of the first load branch 20 and from the latter via the motor M1 to the ground terminal 14.

This current IM1F is formed by two partial currents, that is, as the first partial current, the current IC1L, which is produced by charging of the capacitor C, and on the other hand by the current IL1, which continues as before to flow through the inductance L to the center tap 36 of the freewheeling branch 30.

Furthermore, the current IM1 is in turn divided at the ground terminal 14 into the current IL1, which flows to the second terminal 40 of the inductance L and through the latter, and also a current IV, which flows back to the voltage source V.

In this state, the current IV is equal to the current IC1L, with the current IC1L theoretically continuing to flow until the capacitor C is charged.

The advantageous effects of the freewheeling branch 30 can be achieved with the following ratings of the capacitance C and the inductance L.

$$L \cdot C >> (TZ)^2 \qquad (1)$$

$$C > (\text{maximum value } IM1) \cdot \frac{TZ}{U} \qquad (2)$$

Figure 3:
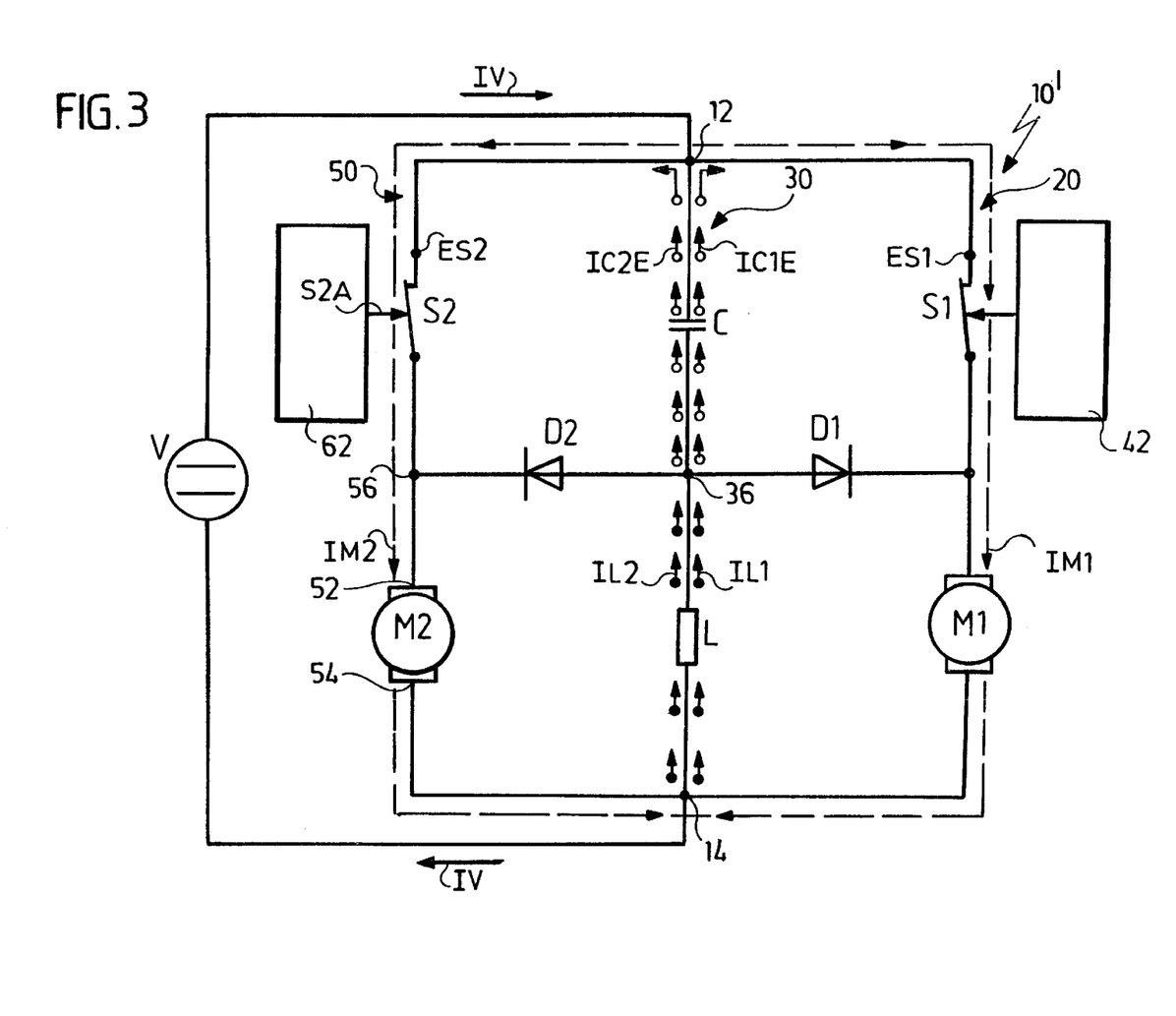
FIG. 3 shows a circuit diagram of a second exemplary embodiment of a control circuit according to the invention, with a freewheeling branch and two load branches, which are both in the energized state.
Figure 4:
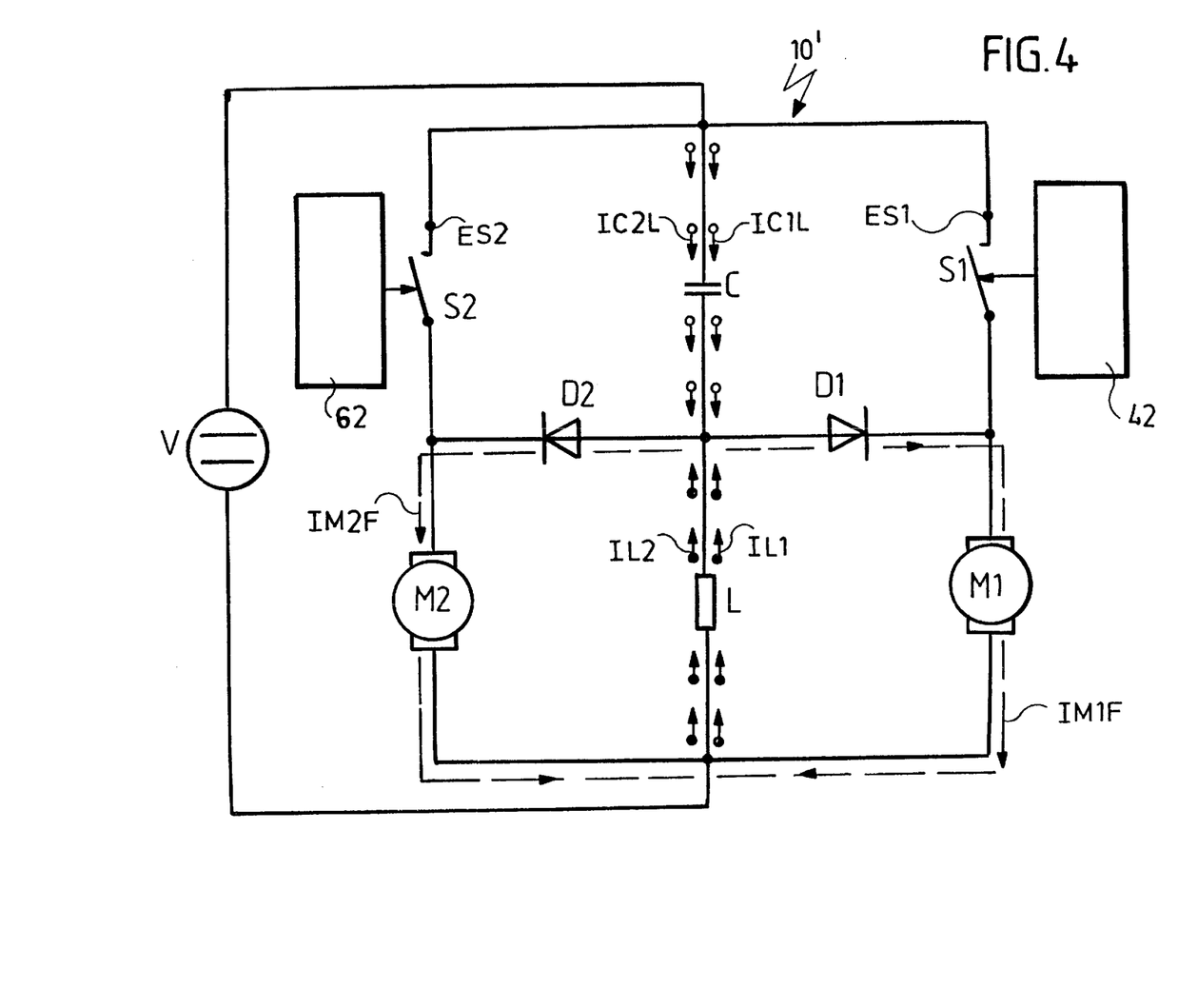
FIG. 4 shows a circuit diagram of the second exemplary embodiment in the freewheeling state of both load branches.
Figure 5:
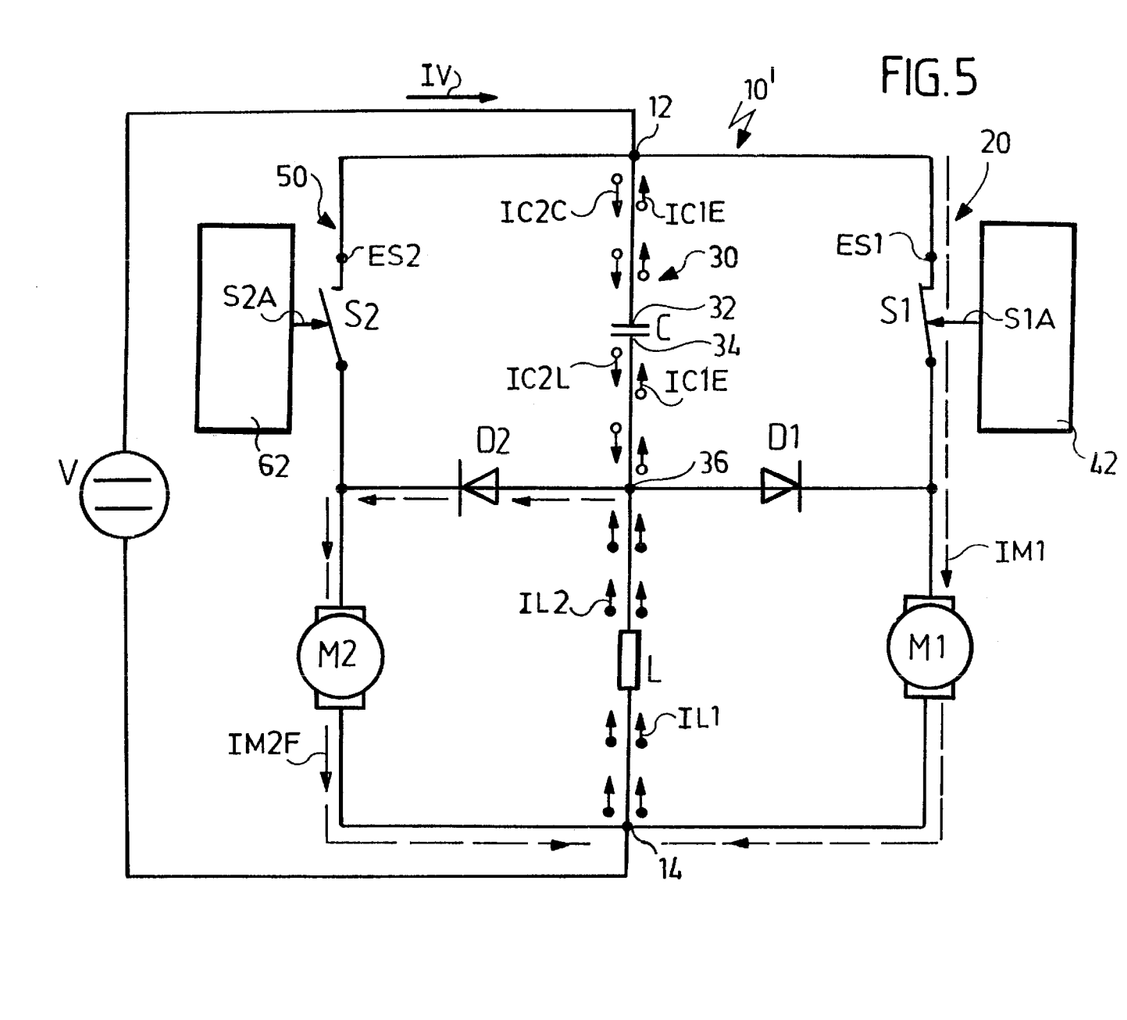
FIG. 5 shows a circuit diagram of the second exemplary embodiment in the freewheeling state of the second load branch and in the energized state of the first load branch.

In the case of a second exemplary embodiment of a drive circuit 10' according to the invention, represented in FIGS. 3 to 5, not only the first load branch 20 but a second load branch 50, formed in a way similar to the first load branch 20, is provided between the supply voltage terminal 12 and the ground terminal 14. The second load branch 50 therefore likewise comprises an electronic switch S2, which is connected in series with an inductive load, that is a second motor M2, the electronic switch S2 lying between the supply voltage terminal 12 and a first terminal 52 of the second motor M2 and thereby being connected by a first terminal ES1 to the supply voltage terminal 12, and a second terminal 54 of the second motor M2 being connected to the ground terminal 14.

Furthermore, the second load branch 50 is provided with a center tap 56, a diode D2 being provided between the center tap 56 and the center tap 36 of the freewheeling branch 30', said diode supplementing the freewheeling branch 30' and being connected with its forward direction in such a way that it allows a current through from the center tap 36 to the center tap 56, but blocks in the reverse direction.

Furthermore, the electronic switch S2 can be driven by a second motor control circuit 62 by means of a pulse-width-modulated drive signal S2A, the drive signal S2A preferably having the same cycle time TZ as the drive signal S1A.

For the rating of the capacitance C, the following applies in the case of the second exemplary embodiment:

$$C > (\text{maximum value } IM1, IM2) \frac{TZ}{U}$$

where the value which corresponds to the greatest maximum current through the inductive load in the load branches 20, 50 is to be used for the (maximum value IM1, IM2).

If, in the case of the second exemplary embodiment of the drive circuit 10' according to the invention, the two switches S1 and S2 are closed, in a way analogous to the first exemplary embodiment, the current IM1 flows via the first motor M1 and the current IM2 flows via the motor M2, the currents IM1 and IM2 respectively being formed by two partial currents, one of which is supplied by the current IV supplied by the voltage source V and the other partial current is supplied by the currents IC1E and IC2E produced during the discharging of the capacitance C, with the partial current IC1E contributing to the current IM1 through the first motor M1 and the partial current IC2E contributing to the current IM2 through the second motor M2.

Furthermore, in a way corresponding to the case of the first exemplary embodiment, represented in FIG. 1, it is also the case with the second exemplary embodiment, represented in FIG. 3, that the currents IL1 and IL2 flow through the inductance L, the currents IL1 and IL2 corresponding to the currents IC1E and IC2E.

Furthermore, the currents IM1 and IM2 are in turn divided at the ground terminal 14 into the partial currents IL1 and IL2, respectively, and further partial currents which produce the current IV flowing to the voltage source V.

If, as represented in FIG. 4, both switches S1 and S2 are switched off, conditions which correspond to those of the first exemplary embodiment, represented in FIG. 2, are obtained. That is to say that the freewheeling currents IM1F and IM2F, which again respectively represent the sum of the currents IC1L and IC2L and IL1 and IL2, respectively [lacuna] through the motors M1 and M2, in a way analogous to the freewheeling state of the first exemplary embodiment, represented and described in FIG. 2.

However, the second exemplary embodiment of the drive circuit 10' according to the invention can be operated in a further state, as represented in FIG. 5, that is in a state in which, for example, the electronic switch S1 is closed and the electronic switch S2 is open.

In this case, in a way analogous to the case represented in FIGS. 1 and 3, in the first load branch 20 the current IM1 flows through the motor M1, while in the second load branch 50 the freewheeling state exists on account of the opened switch S2, so that the current IM2F flows in this branch.

This leads in the freewheeling branch 30 to a situation corresponding to the state of the first load branch 20 in which the current IC1E flows from the first terminal 32 of the capacitance C to the supply voltage terminal 12, to form as a partial current with a further partial current of the current IV the current IM1, with the current IL1 also flowing through the inductance on account of the current IM1 through the first load branch 20.

On the other hand, the second load branch 50 is in the freewheeling state, which means that a current IC2L flows from the second terminal 34 of the capacitor C to the center tap 36 and, furthermore, a current IC2L flows from the supply voltage terminal 12 to the first terminal 34 of the capacitance C, with charging of the capacitance C taking place by the current IC2L.

Furthermore, the freewheeling state in the second load branch 50 leads to a situation in which the current IL2 passes through the inductance L from the base terminal 14 to the center tap 36 and adds together with the current IC2L to form the current IM2F, which flows through the second motor M2.

As a comparison of the directions of the currents IC1E and IC2L shows, they flow in opposite directions, so that they at least partially cancel one another out, so that, depending on whether the current IC1E or the current IC2L is predominant, the resulting current either discharges or charges the capacitor C, this resulting current being smaller than the contributions of the currents IC1E and IC2L.

In addition, as also emerges from the switching states according to FIG. 3 and FIG. 4, it can be clearly seen in the case of the switching state of the second exemplary embodiment according to FIG. 5 that the currents IL1 and IL2 at least retain their direction, and can only vary in their amount, while it is shown by the comparison of the currents IC1E or IC2E and IC1L or IC2L that the latter change their direction in accordance with which of the motors M1 and/or M2 is in the freewheeling state, with the currents IC1E and IC2L at least partially cancelling one another out in the case in which one of the motors, that is the motor M1, is in the energized state and the other of the motors, that is the motor M2, is in the freewheeling state, so that in total only a small discharging or charging current of the capacitance flows.

In addition, the freewheeling branch 30 ensures that the current IV flowing from the voltage source V is substantially uninterrupted, irrespective of the position of the electronic switches S1 or S2, and consequently always keeps flowing, if anything varying in its amount.

Since, whenever according to FIG. 5 one of the motors, for example the first motor M1, is in the energized state and the other of the motors, for example the second motor M2, is in the non-energized state, the currents IC1E and IC2L at least partially cancel one another out, the loading of the freewheeling branch 30 is minimal whenever it is endeavored to achieve such a state for the longest possible periods within the cycle time TZ.

The motor control circuits 42 and 62 are preferably operated in such a way that their cycle time TZ is identical.

Furthermore, it is preferably provided that the pulse-width-modulated drive signals S1A and S2A have not only the same cycle times TZ, but also are phase-locked in relation to one another, to [lacuna] the state that one of the motors M1, M2, for example the first motor M1, is in the energized state, while the other of the motors M2, M1, for example the second motor M2, is in the freewheeling state. For this reason, with a pulse-width-modulated drive signal S1A, the pulse-width-modulated drive signal S2A is phase-locked, to be precise in such a way that its switching-on time period TE1, corresponding to the energizing time TS, falls within a switching-off time period TA2 of the drive signal 52A corresponding to the freewheeling time TF, while on the other hand a switching-on time period TE2 is such that it falls within a switching-off time period TA1 of the first pulse-width-modulated drive signal S1A.

The electronic switches S1 and S2 are in this case closed in the time periods TE1 and TE2, respectively, and open in the time periods TA1 and TA2, respectively, in a way corresponding to the first drive signal S1A or the second drive signal S2A.

Figure 6:
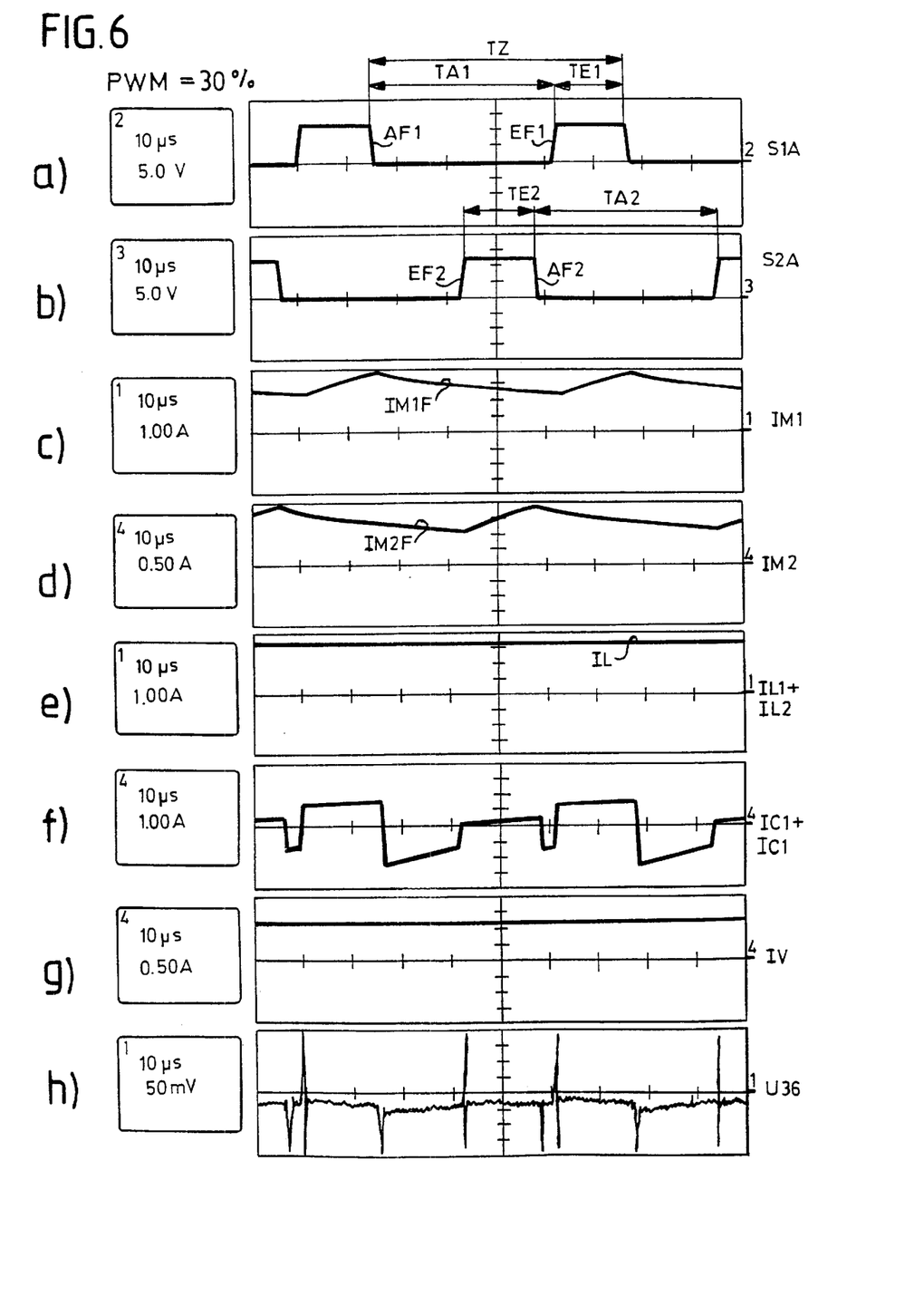
FIG. 6 shows a representation of measured values in the case of the second exemplary embodiment, with a pulse width modulation ratio of 30%.

The currents IM1 and IM2 through the motors M1 and M2 are formed in a corresponding way, as represented in FIGS. 6c and d, respectively, with the different sizes of the motors M1 and M2 leading to different currents IM1 and IM2.

Furthermore, this results in a current IL1 plus IL2, through the inductance L, which is substantially constant over time, as represented in FIG. 6e, while the current IC1 plus IC2 varies, as represented in FIG. 6f.

Finally, FIG. 6h shows that, during the transition from the freewheeling state to the energized state, voltage peaks of the voltage U36 may occur at the center tap 36. These voltage peaks are caused by a non-ideal freewheeling capacitance, which has a not insignificant longitudinal inductance, which has the result that the current through the capacitance C cannot change abruptly and consequently voltage peaks occur at the center tap 36 with respect to the ground terminal 14.

These voltage peaks can be kept small by a connection of the first terminal 32 of the capacitance C to the switches S1, S2 and of the second terminal 34 to the diodes D1, D2, which have an inductance of less than 50 nano Henry.

These voltage peaks also do not have an effect on the supply voltage terminal 12 or the ground terminal 14, since the latter are shielded with respect to the center tap 36 by the capacitor C and the inductance L, respectively. Therefore, the current IV which flows from the voltage source V to the supply voltage terminal 12 and from the ground terminal 14 to the voltage source V is substantially constant, as can be seen from FIG. 6g.

Furthermore, it is notable in FIG. 6h that the changing of the voltage at the capacitance C during a cycle time TZ is small, preferably smaller than 50 mV, which can be achieved by a large capacitance C of, for example, $$C > 30 \text{ (maximum value } IM1, IM2) \frac{TZ}{U}$$

If the pulse width modulation then changes, that is to say the switching-off time period TA1 changes in favor of the switching-on time period TE1, preferably only a shift of a switching-off edge AF1 of the first drive signal S1A takes place, while the switching-on edge EF1 is not shifted.

On the other hand, in the case of the second drive signal S2A, the switching-on edge EF2 is shifted, while the switching-off edge AF2 remains unchanged.

Finally, the first drive signal S1A and the second drive signal S2A are synchronized by the switching-on edge EF1 and the switching-off edge AF2 being in constant phase relationship to one another, for example succeeding one another at such a time interval that the switching-off edge AF2 has just reached the value zero when the switching-on edge EF1 departs from the value zero toward higher values.

As a result, the switching-on edge EF1 and the switching-off edge AF2 prescribe a fixed phase relationship which always ensures that the respective switching-on time period TE1 or TE2 of the one drive signal S1A or S2A occurs when the switching-off time period TA2 or TA1 occurs for the other drive signal S2A or S1A.

This is feasible up until a pulse-width-modulation ratio of almost 50% is reached, since then the possibility of the switching-on time period of the one drive signal S1A or S2A coinciding with the switching-off time period of the other drive signal S2A or S1A is exhausted if an identical cycle time PZ is prescribed for the first drive signal S1A and the second drive signal S2A.

Figure 7:
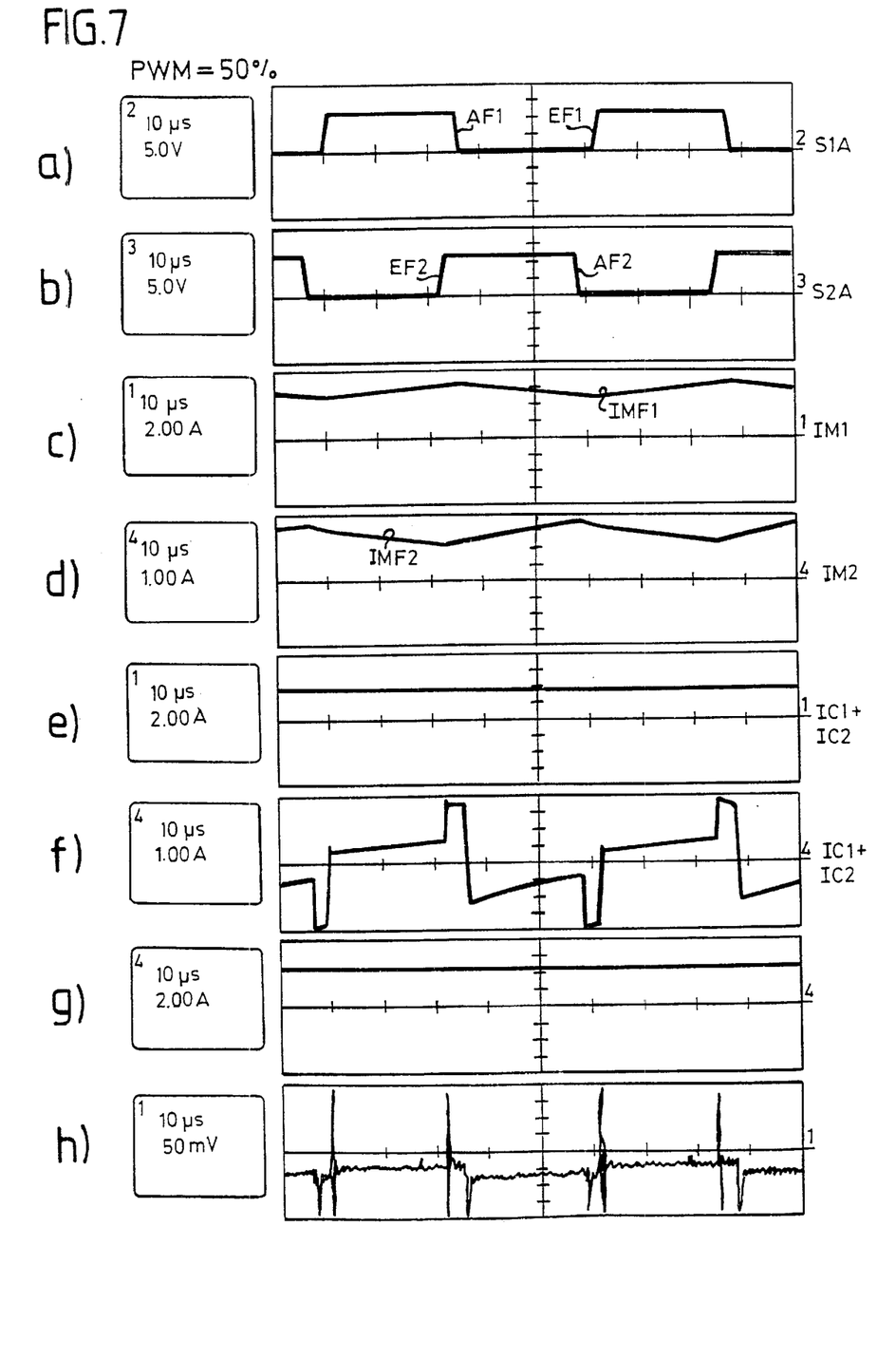
FIG. 7 shows a representation of measured values in the case of the second exemplary embodiment, with a pulse width modulation ratio of 50%

If, on the other hand, a pulse-width-modulation ratio approaching 50% is reached, as represented for example in FIG. 7, brief overlapping of the drive signal S1A and S2A is unavoidable, for example in the region of the switching-off edge AF1 and the switching-on edge EF2.

Consequently, for a short time period, on account of the time overlap of the switching-on edge EF2 with the closed state of the electronic switch S1A, up to the switching-off edge AF1 of the first drive signal S1A, a state which is represented in FIG. 3 is reached, while between the switching-off edge AF2 and the switching-on edge EF1 there is a state which is represented in FIG. 4, that is to say a state in which both electronic switches are open.

This has in this way an effect which is clearly evident in the sum of the currents IC1 plus IC2, as represented in FIG. 7f.

On the other hand, the effect on the motor currents IM1 and IM2 in a comparison with the conditions in the case of a pulse width modulation of 30% is at least qualitatively similar (FIGS. 7c, 7d).

Figure 8:
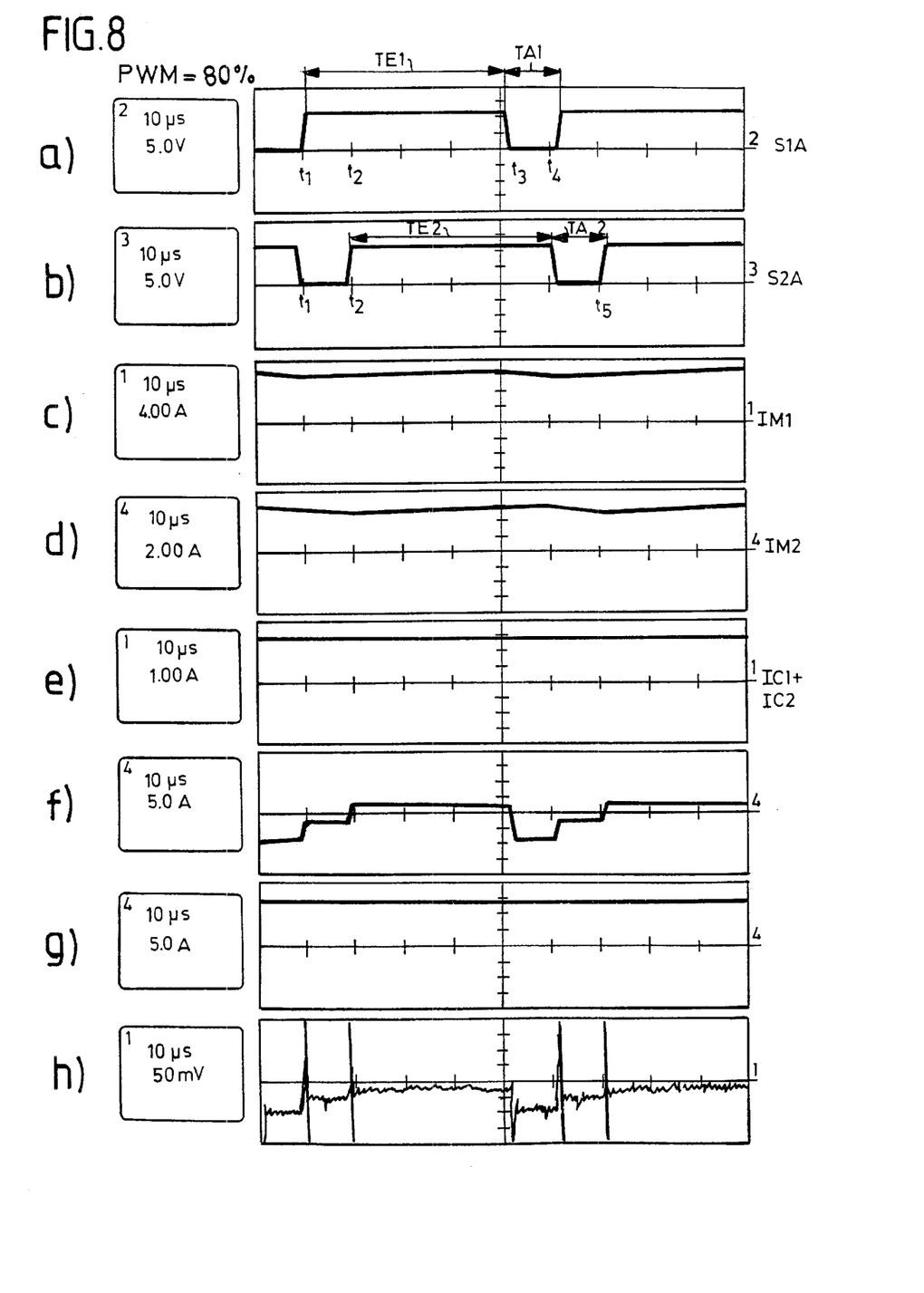
FIG. 8 shows a representation of measured values of the second exemplary embodiment, with a pulse width modulation ratio of 80%.

If, on the other hand, the drive signals S1A and S2A have pulse-width-modulation ratios of approximately 80%, the switching-on time period TE1 and TE2 predominates over the corresponding switching-off time period TA1 and TA2, respectively (FIGS. 8a, 8b). In this case, it is no longer possible for the two drive signals S1A and S2A to be timed in relation to one another in such a way that the switching-on time periods TE1 and TE2 overlap as little as possible, with the locked phase relationship between the switching-off edge AF2 of the second drive signal S2A with respect to the switching-on edge EF1 of the first drive signal being maintained.

Consequently, between the instant $t_1$ and the instant $t_2$, conditions prevail in the case of the second exemplary embodiment in the state according to FIG. 5, that is to say one of the motors M1, M2 is in the energized state, while the other is in the freewheeling state (FIGS. 8a, 8b).

Between the instant $t_2$ and the instant $t_3$, conditions according to FIG. 3 prevail, that is to say both motors are in the energized state.

Between the instants $t_3$ to $t_4$ and $t_4$ to $t_5$, again the conditions corresponding to FIG. 5 likewise prevail, that is to say one of the motors M1, M2 is in the energized state and the other is in the freewheeling state.

It follows from this that, in the case of the second exemplary embodiment with a pulse width modulation of over 80%, switching states according to FIG. 3 and according to FIG. 5 substantially occur, while switching states according to FIG. 4 of the second exemplary embodiment do not occur.

With pulse-width-modulation ratios of approximately 80%, the currents IM1 and IM2 are much higher than in the other cases (FIGS. 8c and 8d).

In addition, the current IL1 plus IL2 reaches its maximum with the pulse width modulation 50% (FIGS. 8e and 8f).

As represented in FIG. 8f, fluctuations occur in the sum of the currents IC1 and ICL, depending on which of the two different motors M1, M2 is in the energized state or in the freewheeling state at the time.

Furthermore, in this case too, the current IV from the voltage source V to the supply voltage terminal 12 and from the ground terminal 14 to the voltage source V is substantially constant (FIG. 8g).

What is claimed is:

1. A control circuit for at least one inductive load, comprising a first load branch, which lies between a first voltage terminal and a second voltage terminal and comprises an electronic switch and the inductive load connected in series, the electronic switch lying between a first terminal of the inductive load and the first voltage terminal, and a second terminal of the inductive load being in connection with the second voltage terminal, a freewheeling branch which has, as a series connection, a capacitance connected to the first voltage terminal and an inductance connected to the second terminal of the inductive load, and also a freewheeling element connected between a center tap between the capacitance and the inductance of the freewheeling branch and the first terminal of the inductive load, said freewheeling element allowing a freewheeling current of the inductive load to flow from the center tap to the first terminal of the inductive load when the electronic switch is open.

2. A control circuit for at least one inductive load, comprising a first load branch, which lies between a first voltage terminal and a second voltage terminal and comprises an electronic switch and the inductive load connected in series, the electronic switch lying between a first terminal of the inductive load and the first voltage terminal, and a second terminal of the inductive load being in connection with the second voltage terminal, a freewheeling branch which has, as a series connection, a capacitance connected to the first voltage terminal and an inductance connected to the second terminal of the inductive load, a freewheeling element connected between a center tap between the capacitance and the inductance of the freewheeling branch and the first terminal of the inductive load, said freewheeling element allowing a freewheeling current of the inductive load to flow when the electronic switch is open, and at least one second load branch being connected in parallel with the freewheeling branch.

3. The control circuit as claimed in claim 2, wherein the second load branch is connected in parallel with the freewheeling branch in the same way as the first load branch.

4. The control circuit as claimed in claim 2, wherein the second load branch has the same circuit configuration as the first load branch.

5. The control circuit as claimed in claim 1, wherein a first terminal of the capacitance of the freewheeling branch is connected to a first terminal of the electronic switch by means of a line whose inductance is less than 50 nano Henry.

6. The control circuit as claimed in claim 1, wherein a second terminal of the capacitance of the freewheeling branch is connected to the respective diode by a line whose inductance is less than 50 nano Henry.

7. The control circuit as claimed in claim 4, wherein there is provided a drive for the electronic switches of the at least two load branches which drives the electronic switches with PWM drive signals of the same period.

8. The control circuit as claimed in claim 7, wherein the PWM drive signals for both load branches are phase-locked in relation to one another.

9. The control circuit as claimed in claim 7, wherein the PWM drive signals are phase-shifted in relation to one another.

10. The control circuit as claimed in claim 7, wherein the switching-on instant of one of the electronic switches and the switching-off instant of the other of the electronic switches are fixed in relation to one another and in that the period of time between the switching-on instant of the one of the electronic switches and the switching-on instant of the other of the electronic switches varies in a way corresponding to the value of the PWM ratio to be set.

11. The control circuit as claimed in claim 4, wherein a drive drives the electronic switches of the first and the second load branch in such a way that one of the electronic switches is switched on when the other of the electronic switches is switched off.

12. The control circuit as claimed in claim 4, wherein in a first operating range, switching-on of each of the electronic switches only takes place when the other electronic switch is switched off.

13. The control circuit as claimed in claim 12, wherein in the first operating range, the switching-off of each of the switches takes place with a time interval before the switching-on of the other switch.

14. The control circuit as claimed in claim 13, wherein in the first operating range, a minimum time of 0.5% of the period is provided between the switching-off of each of the switches and the switching-on of the other of the switches.

15. The control circuit as claimed in claim 12, wherein in the first operating range, the switching-on instant of the one electronic switch and the switching-off instant of the other electronic switch vary.

16. The control circuit as claimed in claim 12, wherein in a second operating range, switching-on of one of the electronic switches only takes place during the switching-off or after the switching-off of the other of the electronic switches.

17. The control circuit as claimed in claim 12, wherein in a second operating range, switching-on of each of the electronic switches takes place after the switching-on and before the switching-off of the other of the electronic switches.

18. The control circuit as claimed in claim 12, wherein the product of the value of the inductance and the value of the capacitance in the freewheeling branch is greater than the square of the cycle time of the pulse-width-modulated drive signals.

19. The control circuit as claimed in claim 1, wherein the value of the capacitance of the freewheeling branch is greater than the product of the maximum value of the current through the inductive load by ten times the cycle time, divided by the voltage between the supply voltage terminal and the ground terminal.

* * * * *

UNITED STATES PATENT AND TRADEMARK OFFICE
CERTIFICATE OF CORRECTION

PATENT NO.    : 6,621,309 B2
DATED         : September 16, 2003
INVENTOR(S)   : Roder et al.

It is certified that error appears in the above-identified patent and that said Letters Patent is hereby corrected as shown below:

Column 12,
Line 28, change "12" to -- 7 --.

Signed and Sealed this

Thirtieth Day of December, 2003

JAMES E. ROGAN
*Director of the United States Patent and Trademark Office*